United States Patent
Li et al.

(10) Patent No.: US 9,343,378 B2
(45) Date of Patent: May 17, 2016

(54) OPTICAL CONTROL OF MULTI-STAGE THIN FILM SOLAR CELL PRODUCTION

(71) Applicant: Alliance for Sustainable Energy, LLC, Golden, CO (US)

(72) Inventors: Jian Li, Golden, CO (US); Dean H. Levi, Indian Hills, CO (US); Miguel A. Contreras, Golden, CO (US); John Scharf, Edgewater, CO (US)

(73) Assignee: ALLIANCE FOR SUSTAINABLE ENERGY, LLC, Golden, CO (US)

( * ) Notice: Subject to any disclaimer, the term of this patent is extended or adjusted under 35 U.S.C. 154(b) by 126 days.

(21) Appl. No.: 14/204,795

(22) Filed: Mar. 11, 2014

(65) Prior Publication Data
US 2014/0273295 A1 Sep. 18, 2014

Related U.S. Application Data

(60) Provisional application No. 61/778,079, filed on Mar. 12, 2013.

(51) Int. Cl.
*H01L 21/66* (2006.01)
*H01L 31/0749* (2012.01)
*H01L 31/0392* (2006.01)
(Continued)

(52) U.S. Cl.
CPC ........... *H01L 22/12* (2013.01); *H01L 22/24* (2013.01); *H01L 22/26* (2013.01); *H01L 31/0322* (2013.01); *H01L 31/03923* (2013.01);
(Continued)

(58) Field of Classification Search
CPC ......... H01L 22/12; H01L 22/26; H01L 22/24; H01L 31/0322; H01L 31/0749; H01L 31/03923; H01L 31/046; H01L 31/18; H01L 21/02568

USPC ................................................ 438/95, 16, 7
See application file for complete search history.

(56) References Cited

U.S. PATENT DOCUMENTS 4,335,266 A * 6/1982 Mickelsen .......... H01L 31/0322
  136/260
5,441,897 A   8/1995 Noufi et al.
(Continued)

FOREIGN PATENT DOCUMENTS

WO   2012/112880   8/2012

OTHER PUBLICATIONS

Marsillac et al., "Toward ultra thin CIGS solar cells," Proceedings of 2012 IEEE 38th Photovoltaic Specialists Conference, Austin, TX, Jun. 3-8, 2012, pp. 1492-1494.
(Continued)

*Primary Examiner* — Michael Trinh
(74) *Attorney, Agent, or Firm* — John C. Stolpa; Robert G. Pittelkow (57) ABSTRACT

Embodiments include methods of depositing and controlling the deposition of a film in multiple stages. The disclosed deposition and deposition control methods include the optical monitoring of a deposition matrix to determine a time when at least one transition point occurs. In certain embodiments, the transition point or transition points are a stoichiometry point. Methods may also include controlling the length of time in which material is deposited during a deposition stage or controlling the amount of the first, second or subsequent materials deposited during any deposition stage in response to a determination of the time when a selected transition point occurs.

33 Claims, 7 Drawing Sheets

(51) Int. Cl.
*H01L 31/046* (2014.01)
*H01L 31/032* (2006.01)

(52) U.S. Cl.
CPC .......... *H01L31/046* (2014.12); *H01L 31/0749* (2013.01); *H01L 2924/0002* (2013.01)

(56) References Cited

U.S. PATENT DOCUMENTS

| | | | | |
|---|---|---|---|---|
| 6,383,359 | B2* | 5/2002 | Arao | C25D 9/08 |
| | | | | 204/192.1 |
| 7,935,558 | B1* | 5/2011 | Juliano | C23C 14/0623 |
| | | | | 204/298.13 |
| 2011/0117681 | A1* | 5/2011 | Bardos | C23C 16/52 |
| | | | | 438/7 |
| 2014/0093985 | A1* | 4/2014 | Li | H01L 22/12 |
| | | | | 438/7 |

OTHER PUBLICATIONS

Ranjan et al., "Real time analysis of ultra-thin CIGS thin film deposition," Proceedings of 2012 IEEE 38th Photovoltaic Specialists Conference, Austin, TX, Jun. 3-8, 2012, pp. 452-453.
Begou et al., "Real time spectroscopic ellipsometry of CuInSe 2: Growth dynamics, dielectric function, and it dependence on temperature," Rapid Research Letters, vol. 5, Issue 7, Jul. 2011, pp. 217-219.
Ranjan et al., "Investigation of the growth process and optical transitions as a function of Ga content in CuIn 1-xGA xSe 2 thin films at 570 degrees C," Proceedings of 2012 IEEE 37th Photovoltaic Specialists Conference, Seattle, WA, Jun. 19-24, 2012, pp. 433-435.
Ranjan et al., "Real-time analysis of the microstructural evolution and optical properties of Cu(InmGa)Se 2 thin films as a function of Cu content," Rapid Research Letters, vol. 6, Issue 1, Jan. 2012, pp. 10-12.

* cited by examiner

OPTICAL CONTROL OF MULTI-STAGE THIN FILM SOLAR CELL PRODUCTION

RELATED APPLICATIONS

This application claims priority to U.S. Provisional Application 61/778,079 entitled OPTICAL CONTROL OF MULTI-STAGE THIN FILM SOLAR CELL PRODUCTION filed on Mar. 12, 2013 which is incorporated herein by reference in its entirety.

CONTRACTUAL ORIGIN

The United States Government has rights in this invention under Contract No. DE-AC36-08GO28308 between the United States Department of Energy and the Alliance for Sustainable Energy, LLC, the manager and operator of the National Renewable Energy Laboratory.

BACKGROUND

Thin film photovoltaics (PV) based on $Cu(In_xGa_{1-x})Se_2$ (CIGS) and similar technologies such as $Cu_2ZnSnS_4$ (CZTS) or $Cu_2ZnSnSe_4$ (CZTSe) are promising candidates for low-cost, high-efficiency solar cell applications. CIGS technology has demonstrated the highest energy conversion efficiency among all polycrystalline thin film PV technologies.

Many materials used in thin film technologies are deposited according to a multi-stage method, in which certain elements are introduced alternatively into a deposition matrix. For example, with respect to a CIGS film, a three stage method has been demonstrated to be effective, with In and Ga deposited in a first stage, Cu deposited in a second stage and In and Ga deposited in a third state. Deposition during each of the foregoing three stages occurs in the presence of excess Se. Substantial detail concerning the fabrication of CIGS and related thin films according to a multi-stage method may be found in commonly owned U.S. Pat. No. 5,441,897 titled "Method of Fabricating High-efficiency $Cu(In,Ga)(Se,S)_2$ Thin Films for Solar Cells" which patent is incorporated herein by reference for all matters included therein.

It is common that the optimum ratio of constituent elements in a high-performance thin film PV device is off-stoichiometry. Furthermore, the target compositional ratios for acceptable thin film properties and device performance can be relatively narrow. For example, the best performing $Cu(In_xGa_{1-x})Se_2$ solar cells fabricated according to the three stage method noted above have a Cu/(In+Ga) ratio in the general range of 0.8-0.9. Cell performance is perhaps optimized when the Cu/(In+Ga) ratio is close to 0.9. If the Cu/(In+Ga) ratio significantly exceeds 0.9 however, device performance will drop sharply with increasing Cu/(In+Ga) ratio.

Furthermore, the distribution of In+Ga between the first and third stages and the total film thickness are also important parameters that significantly affect the final solar cell performance. Precise control of the elemental composition, elemental distribution between stages and film thickness is difficult in a multiple stage process for many reasons, including but not limited to the fact that deposition rates of different stages may vary, even for stages depositing the same elements. Deposition rate variations can be intentional, for example as needed for optimizing certain material properties or unintentional, for example as a result of system instability. A need exists for methods and apparatus providing for the monitoring and control and ideally the real-time monitoring and control of multi-stage thin film deposition processes. In particular, a need exists for the monitoring and control and ideally the real-time monitoring and control of one or more of the following parameters: (1) the elemental composition of a deposited thin film; (2) the distribution of elements among stages; and/or (3) the total film thickness.

The embodiments disclosed herein are intended to overcome one or more of the limitations described above. The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

Embodiments disclosed herein include methods of depositing and controlling the deposition of a film deposited in multiple stages. The disclosed deposition and deposition control methods comprise depositing a first material in a first deposition stage onto a surface associated with a substrate, thereby forming a deposition matrix. The disclosed methods further include depositing a second material on the deposition matrix in a second deposition stage. During the deposition processes, optical monitoring of the deposition matrix is performed to determine a time when at least one transition point occurs. In certain embodiments, the transition point or transition points are a stoichiometry point.

The disclosed methods encompass multi-stage deposition processes with any number of stages. For example, a method may include continuing the second deposition stage by depositing additional second material on the deposition matrix to cause the deposition matrix to have a compositional excess of the second material; depositing additional first material on the deposition matrix in a third deposition stage, while optically monitoring the deposition matrix to determine a time when a second transition point occurs; and continuing the third deposition stage by depositing additional first material on the deposition matrix to cause the deposition matrix to have a compositional excess of the first material.

In the disclosed methods, the first material and second materials may be of any composition. In selected embodiments, the first material may be composed of or include one or more Group 13 elements and the second material may be composed of or include at least one Group 11 element. For example, the first material may be composed of In and Ga and the second material may be Cu. If desired, deposition stages may be made in the presence of an excess amount of at least one other element.

The deposition matrix may be optically monitored by any known optical technique including but not limited to one or more of ellipsometry; polarized reflectance spectroscopy or diffuse reflectance spectroscopy.

In certain embodiments, the substrate may be moved within the deposition chamber while performing the first, second, third or subsequent deposition stages. Methods may also include controlling the length of time in which material is deposited during a deposition stage, in response to the determination of the time when the one or more transition points occur. Similarly, methods may include controlling the amount of the first, second or subsequent materials deposited during any deposition stage in response to a determination of the time when a selected transition point occurs. The amount of the first or second material deposited during any deposition stage may be controlled by directly controlling a deposition rate, controlling the speed at which the substrate is moved, controlling the start or termination of selected deposition stages or controlling other process variables.

The disclosed methods may also be utilized to determine a final compositional ratio of the first, second or other materials based upon the determined time of selected transition points and the total time of the various deposition stages. Furthermore, the methods may be utilized to determine the distribution of constituent elements of the deposited film. Methods may also include optically determining the thickness of the deposition matrix.

Alternative embodiments include systems suitable for implementing the disclosed methods. For example, a system may comprise a deposition chamber; an optical probe; a controller receiving data from the optical probe; and a non-transitory machine readable medium having encoded thereon a set of instructions executable by the controller to perform a disclosed method.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein are to be considered illustrative rather than limiting.

DESCRIPTION

Unless otherwise indicated, all numbers expressing quantities of ingredients, dimensions, reaction conditions and so forth used in the specification and claims are to be understood as being modified in all instances by the term "about".

In this application and the claims, the use of the singular includes the plural unless specifically stated otherwise. In addition, use of "or" means "and/or" unless stated otherwise. Moreover, the use of the term "including", as well as other forms, such as "includes" and "included", is not limiting. Also, terms such as "element" or "component" encompass both elements and components comprising one unit and elements and components that comprise more than one unit unless specifically stated otherwise.

Certain abbreviations may be made herein with respect to the description of deposited films, semiconductors and semiconductor alloys. These abbreviations shall not be construed as limiting the scope of the disclosure or claims. For example, the form CIGS is a commonly used abbreviation for $Cu(In_xGa_{1-x})Se_2$ materials. Abbreviated forms such as "CIGS" are defined as equivalent to an expanded form. In some of the devices, films or layers discussed herein, several elements can be combined with or substituted for each other, such as In and Ga, or Se and S. It is not uncommon in this field to include those combinable or interchangeable elements in a set of parentheses, such as (In,Ga) or (Se,S). The descriptions in this specification sometimes utilize this convenience. Alternatively, the expression [In+Ga] is used to indicate the presence of both elements in an unspecified ratio. Finally, also for convenience, the elements are discussed with their commonly accepted chemical symbols, including copper (Cu), indium (In), gallium (Ga), selenium (Se), sulfur (S), hydrogen (H), and molybdenum (Mo), and the like.

As is well known to those skilled in the material and chemical sciences, the elements may be arranged into a periodic table according to atomic structure and properties. Certain groups of elements are often used in the preparation of thin film absorber layers and in some cases one element from a group may be substituted for another. For example, a CIGS absorber layer typically includes Cu, In, Ga and Se. S, which is in the same periodic table group as Se may be used in certain variations of a CIGS layer. It is therefore useful herein to discuss groups of elements. In such instances, the IUPAC nomenclature current at the time of this disclosure will be observed. Therefore, the discussion below may (for example) describe a Group 11 element, which could include Cu, Ag and Au, a Group 13 element which includes Al, Ga and In or a Group 16 element which includes O, S and Se. The foregoing Groups are set forth as examples of nomenclature. The embodiments disclosed herein are not limited to any particular elements or periodic table groups.

The method and apparatus embodiments disclosed herein relate to thin film photovoltaics (PV) having active regions of $Cu(In_xGa_{1-x})Se_2$ (CIGS) or similar materials such as $Cu(In_xGa_{1-x})S_ySe_{2-y}$ (CIGSS), $Cu_2ZnSnS_4$ (CZTS), $Cu_2ZnSnSe_4$, (CZTSe), CdTe or other thin films. Although the embodiments described in detail below are typically described with respect to a CIGS film or a CIGS based solar cell, the scope of this disclosure is intended to encompass all similar thin film and PV technologies.

Figure 1:
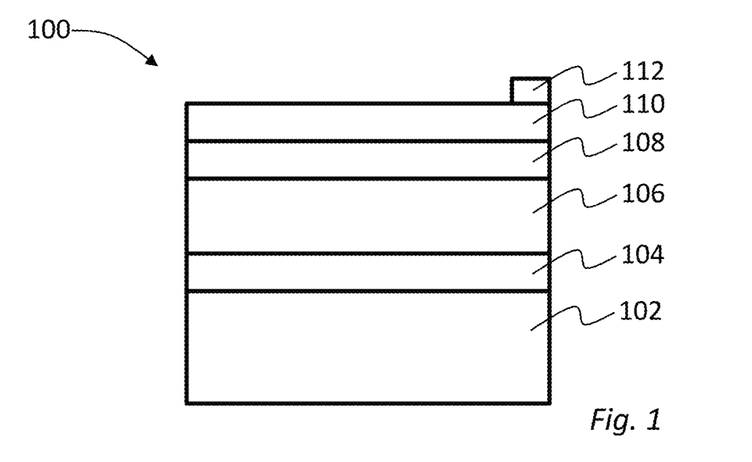
FIG. 1 is a simplified schematic diagram of a solar cell having a thin film absorber layer.

CIGS PV devices are typically manufactured on a substrate which is often but not always a soda lime glass or stainless steel substrate. A highly simplified CIGS solar cell is schematically illustrated in FIG. 1 and is composed of at least one active semiconductor layer and associated substrate, window and contact layers. The embodiments disclosed herein can be related to any layer(s). Thus, the embodiments described herein are described with reference to a highly simplified CIGS solar cell such as illustrated in FIG. 1. It is important to note however, that the various methods, systems and apparatus described herein are not limited specifically to CIGS cells. The recited methods and systems are applicable to any PV device or solar cell which features a layer, typically a thin film absorber layer, which is deposited in a multi-stage deposition process.

As illustrated in FIG. 1 a simplified CIGS solar cell 100 includes a substrate 102. An approximately 300 nm-1000 nm thick molybdenum back contact 104 is deposited on the substrate 102. A CIGS active absorber layer 106 is deposited or grown on the molybdenum back contact layer 104. The solar cell is completed with a thin n-type buffer such as a CdS layer 108, a ZnO window layer 110 and front contacts 112. It is important to note that the CIGS solar cell illustrated in FIG. 1 is highly simplified and an actual device may have various other active, buffer, window or other layers or regions which are not illustrated. The simplified FIG. 1 solar cell is shown only to provide structural context for the discussion below concerning methods and apparatus for controlling the deposition of a thin film in multiple stages and therefore controlling thin film layer properties and device performance.

As used herein, a multiple-stage deposition process is defined as a deposition process where one functional layer is deposited in two or more deposition stages. The individual deposition stages may be separated by time where no deposition occurs. Alternatively, in a production line, the deposition stages may be separated by location along a conveyor or other device which moves a substrate through production. Individual deposition stages will typically feature the deposition of a slightly or significantly different composition, when compared to deposition stages immediately preceding or following the subject deposition stage. In certain instances the composition of the material deposited in various deposition stages may alternate. Temperature, pressure and other deposition parameters may be varied between or during deposition stages. There is no limit upon the number of stages used beyond two, although three stage deposition methods are common in the fabrication of CIGS and similar absorber layers. It is important to note that although a multi-stage deposition process includes the sequential or alternating deposition of various different materials, the resulting thin film may, in certain instances be a substantially homogenous structure. In other instances dictated by various deposition parameters and materials, the resulting thin film may have discrete sub-layers or include various material gradients within the layer or film.

Additional disclosure concerning multi-stage deposition techniques may be found in commonly owned U.S. Pat. No. 5,441,897 titled "Method of Fabricating High-efficiency $Cu(In,Ga)(Se,S)_2$ Thin Films for Solar Cells" which patent is incorporated herein by reference for all matters included therein. Very generally, one example multi-stage deposition process, a three stage CIGS deposition process involves a first stage codeposition of In, Ga, and Se. This is followed by a second stage where Cu and Se are deposited at a higher temperature to allow for diffusion and intermixing of elements. In the third and final stage In, Ga, and Se are again deposited to make the overall composition of the CIGS layer somewhat Cu deficient.

A multi-stage deposition process may be implemented with any known deposition technique, including but not limited to evaporation, sputtering, electrodeposition, chemical vapor deposition, other evaporative technologies, gas-phase chemical processes or liquid-phase chemical processes. It is important to note that the elements deposited in each stage of the multi-stage process do not always remain in distinct sub-layers. In some instances, the deposited elements intermix and diffuse to become a somewhat homogenous thin film. In other instances, thin films deposited according to a multi-stage process exhibit sub-layers or material gradients.

A multi-stage deposition process may alternatively be described with respect to groups of deposition elements. For example, the above described three-stage CIGS deposition process involves a first deposition stage of Group 13 elements. The second stage includes the deposition of at least one Group 11 element. The third state includes the additional deposition of Group 13 elements. As noted above, the final ratio of the Group 13 elements to the Group 11 element (the Cu to In+Ga ratio in the case of a CIGS cell) is important to device performance. This ratio will be generically referred to below as the Group 11/13 ratio or simply the 11/13 ratio.

Multi-stage deposition processes are complex and difficult to control. In particular, it is difficult to control: (1) the final 11/13 ratio in the entire film; (2) the distribution of Group 11 or Group 13 elements between the various stages and (3) the total film thickness. The methods and apparatus described herein comprise a comprehensive system to measure or estimate and potentially control the properties and processes mentioned above. In certain instances the systems and methods provide for real-time control. As detailed below, the disclosed systems and methods feature optical measurements of the thin film as it is being deposited in various stages. The optical measurements are then used for real time or in-line measurement and control. Thus, if a specific 11/13 ratio, a specific distribution of materials, or a specific film thickness is desired, control signals generated as described herein can be sent to (1) start or terminate each or some of the multiple stages in the case of stationary substrates; or (2) adjust the moving speed of the substrates, the deposition rates, or the starting/ending positions of each or some of the stages in the case of a production line featuring moving substrates.

The determination and control of the final 11/13 ratio in the thin film and the distribution of Group 11 or Group 13 elements between the various stages can be based on the timing (for stationary substrates) or timing-based positioning (for moving substrates) of one or more transition points with known compositional ratios (e.g., those of stoichiometry) that occur during a multi-stage deposition process as described in more detail below. A stoichiometry point is defined as the point in time during a deposition stage when the ratios of different elements in the deposited matrix follow a certain chemical molecular formula. For example, in a CIGS film, a stoichiometry point occurs during deposition when the combined atomic quantity of In+Ga equals the atomic quantity of Cu, In another example, a CZTS film, the Cu/Zn ratio is 2 at the stoichiometry point.

The time or production-line location of these stoichiometry points, together with the time lengths or traveled distances within various stages, reflects the intrinsic relationship between the deposition rates of any stages, and hence can be used to calculate the composition as well as the distribution of materials in the deposited film, as detailed below. The calculation of film thickness may also be based upon optical measurements. Thus, the optical control capabilities described herein can be implemented without determining the actual deposition rates of any particular stage.

The embodiments disclosed herein can be based on any type of optical reflection measurements, such as ellipsometry, spectroscopic ellipsometry, non-collimated beam ellipsometry, polarized reflectance spectroscopy, or diffuse reflectance spectroscopy. These and similar techniques can be incorporated into a small batch laboratory deposition chamber or a full production-scale deposition system. The disclosed optical probe(s) may rely upon one or multiple wavelengths of light. The optical technique utilized should be able to identify a stoichiometry point, for example by returning data concerning alloy composition or a semiconductor to metal transition. Alternatively, there may exist materials or processes in which phase transitions or other material property transitions occur at certain known off-stoichiometry compositions. The disclosed optical methods described herein are useful in these cases too, even though a stoichiometry point as defined above is not identified. Therefore, the disclosed methods and apparatus may be used to identify any type of transition point to which the optical method is sensitive, including a stoichiometry point.

Figure 2:
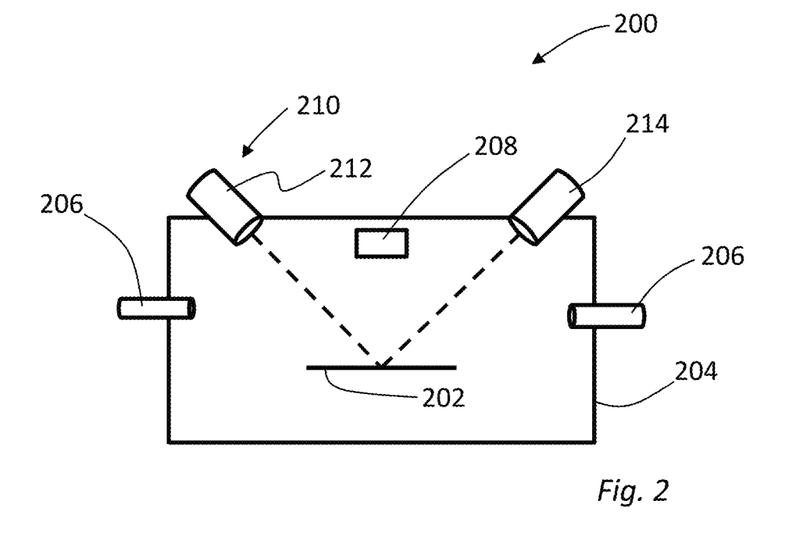
FIG. 2 is a simplified schematic diagram of a deposition chamber as disclosed herein.
Figure 4:
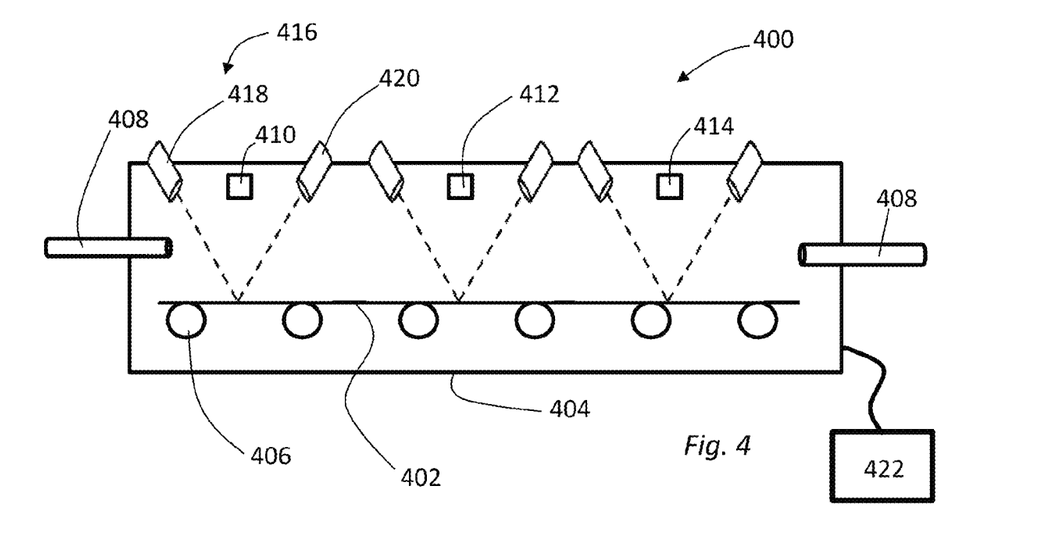
FIG. 4 is a simplified schematic diagram of an alternative deposition system as disclosed herein.

Two non-limiting examples of PV fabrication systems 200 and 400 suitable for implementing the above described techniques are illustrated in FIG. 2 and FIG. 4. A small batch system 200, schematically illustrated in FIG. 2, includes a substrate 202 placed within a process chamber 204. The process chamber 204 also includes gas inlets 206 and one or more elemental targets or deposition sources 208. The deposition sources 208 may be activated as desired to achieve a multi-stage deposition process. The system 200 also includes various heating elements, vacuum pumps, pressure controls and other elements (not shown) as are known in the art to provide for the deposition of a thin film from the deposition source 208 and/or gas within the deposition chamber on a surface associated with the substrate 202. Deposition can proceed in multiple stages according to any known deposition method. The system 200 also includes an optical probe 210 providing for ellipsometry or another polarized or non-polarized reflectance measurement of the thin film as it is formed on the surface of the substrate 202. The optical probe 210 may include at least one light source 212 and one photodetector 214. In other embodiments, no light source is required, such as embodiments where emission from a sample can form the optical signal. A commercial implementation is likely to involve multiple light sources and multiple photodetectors. In addition a commercial implementation is likely to operate at multiple selected wavelengths.

During the various deposition stages, the optical probe 210 serves to detect one or more stoichiometry or transition points. As noted above, a most basic type of stoichiometry point occurs when two elements are present in the deposition matrix in equivalent atomic quantities. More typically, a stoichiometry point occurs when the combined atomic quantities of elements in a first group are equally present in the deposition matrix with an element or the combined quantities of elements in a second group. For example, in a CIGS film, a stoichiometry point occurs during deposition when the combined atomic quantity of In+Ga equals the atomic quantity of Cu.

Figure 3:
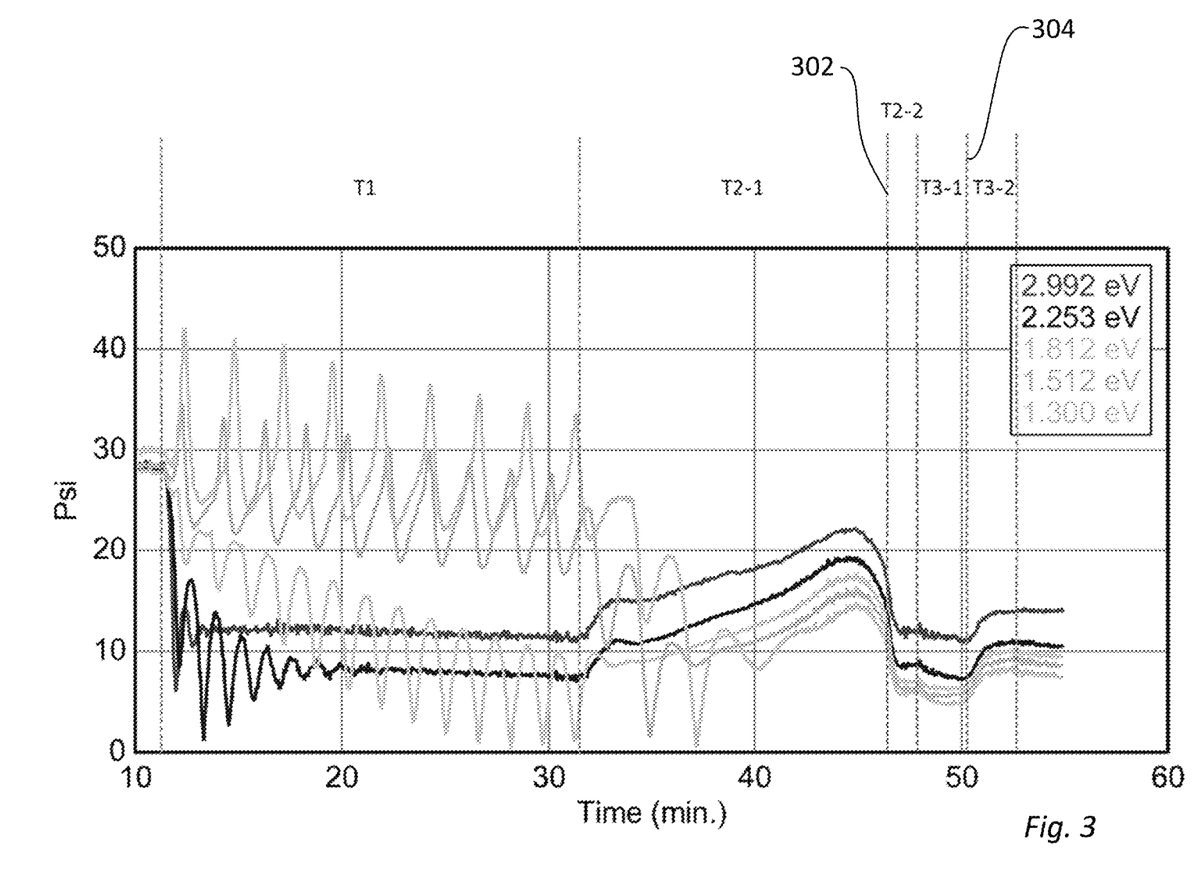
FIG. 3 is a graph representation of the optical data collected by a system as disclosed herein.

A stoichiometry point may be determined by observing or analyzing optical data from the optical probe(s). For example, the optical data may be analyzed to determine alloy composition or a semiconductor to metal transition as the thin film is deposited. FIG. 3 is a graphical representation of psi ($\Psi$) measured with spectroscopic ellipsometry during the deposition of a CIGS film. The data required to produce FIG. 3 and determine $\Psi$ can be collected with an optical probe such as probe 210 described above or probe 416 described below. In FIG. 3, tan($\Psi$) is the amplitude reflection ratio of the p-polarized light over that of the s-polarized light. Furthermore, FIG. 3 illustrates $\Psi$ during a multi-stage deposition process. In particular, $\Psi$ is plotted across timespan T1 which is a first stage of depositing In+Ga onto a substrate, $\Psi$ is also shown through timespan T2, including T2-1 and T2-2, which collectively represent the second stage of depositing Cu onto the deposition matrix. Finally, $\Psi$ is shown with respect to T3 which includes T3-1 and T3-2 representing the third deposition stage of depositing additional In+Ga onto the deposition matrix.

As shown in FIG. 3, $\Psi$ can be used to determine two stoichiometry points. Stoichiometry point S1 (302) occurs at a time of T2-1 into the second stage of deposition, when the [In+Ga] to Cu ratio equals 1. Stoichiometry point S2 (304) occurs at a time of T3-1 into the third stage of deposition, when the [In+Ga] to Cu ratio equals 1. These two stoichiometry points exist because Cu is being deposited during the second deposition stage to a point where the film is Cu rich and [In+Ga] is being deposited during the third deposition stage to a point where the film is Cu poor.

A transition point, including but not limited to a stoichiometry point such as S1 or S2 may be observed because the optical properties of the developing film change at or near a transition point. In general, the optical data evolves smoothly if the film grows without the emergence or disappearance of an isolated layer at the surface. When S1 or S2 is approached, the observed smooth growth is broken because in the CIGS example) an isolated $Cu_2Se$ layer emerges (for S1) or disappears (for S2). Therefore the corresponding optical data would exhibit detectable sharp features around these transitions. The detected or observed optical variation occurs because: (1) the isolated surface layer normally has an optical property different from the underlying bulk part of the film; and (2) the existence of the interface between the surface layer and the bulk film modifies the optical signals (particularly so for polarization states and hence for ellipsometry measurements). The specific visible features at a transition point may vary depending on growth conditions such as the substrate temperature, the deposition rates, the film thickness or other parameters. In the film optically measured to produce FIG. 3, the sharp drop in $\Psi$ at about 46 minutes is indicative of S1; the start of the increase in psi at about 50 minutes is indicative of S2. These transition points have been experimentally verified by many depositions.

Other types of sharp features exist in other ellipsometry data since ellipsometry measures more than just $\Psi$. These other features can be used in combination with $\Psi$, alone or in combination with each other to more precisely determine or confirm the timing of S1, S2 or another transition point. Furthermore, again with respect to a CIGS film, it may be possible to measure an optical property of the isolated $Cu_2Se$ layer to form an optical model useful for further indication of the appearance of S1 or S2.

Based upon the foregoing, the system 200 may be utilized to observe or determine and control certain characteristics or parameters of the thin film being deposited in a multi-stage process. An alternative system 400 is schematically illustrated in FIG. 4. In the FIG. 4 embodiment, the substrate 402 continuously or intermittently moves through a process chamber 404 on a conveyor 406 or other apparatus suitable for moving a substrate. In certain embodiments, the substrate is a material which may be rolled along a length, such as stainless steel. The system 400 also includes gas sources 408, and multiple deposition targets 410-414. The system 400 further includes heating elements, vacuum pumps, pressure controls and other elements (not shown) as are known in the art to provide for the deposition of a thin film of CIGS or another material on the substrate 402 as it moves through the process chamber 404.

Multi-stage deposition occurs in the system 400, even though the system provides for continuous production, because the various individual deposition sources 410, 412 and 414 are adjacent to a given location with respect to the substrate 402 at sequential points in time as the substrate moves through the process chamber. The system 400 also includes one or more optical probes 416 which typically include light sources 418 and photodetectors 420. The optical probes 416 provide for real-time in situ ellipsometry or another technique of polarized or non-polarized reflectance measurement at one or more wavelengths as the thin film is formed on a surface associated with the substrate 402.

The methods described herein therefore apply to either a smaller system 200 or a system 400 where the substrate is moved through a process chamber. In a moving substrate embodiment, a timed parameter, for example the length of time in which stage 1 deposition occurs, may be converted to a distance measurement along the conveyor 406 since the speed of the conveyor is known. In a moving substrate embodiment, optical measurements can be performed along the entire length of the production line and/or across the width of the production line without moving the optical probe(s). In multiple probe embodiments, the optical probes can be positioned along the production line at intermittent locations where important material property transitions are predicted to occur.

A system 400 may include any number of fixed optical heads placed along the production line. In alternative embodiments, optical heads may be provided that move at the same speed as the substrate along the production line or within critical sections. In addition, any system 400 may be implemented with optical heads having a beam which is expanded to cover an area broader than a single point. This configuration can provide for continuous measurement of all substrate points along a production line with only one optical system and without moving the optical heads.

In any embodiment, the light source and detector of an optical probe may be in electrical or optical digital communication with a processor or controller such as a dedicated control system computer 422 of FIG. 4. The controller, as is well known in the data processing arts may include a non-transitory storage medium having instructions providing for the automated or semi-automated implementation and control of the methods and systems disclosed herein. For example, the controller may automatically control the output from the light source, and receive data from the detector. From the data, the controller may calculate and implement control signals sent in real-time to other elements of a system to, for example, adjust the moving speed of the substrates, the deposition rates, the starting and ending positions of each or some of the deposition stages or other process variables.

Figure 5:
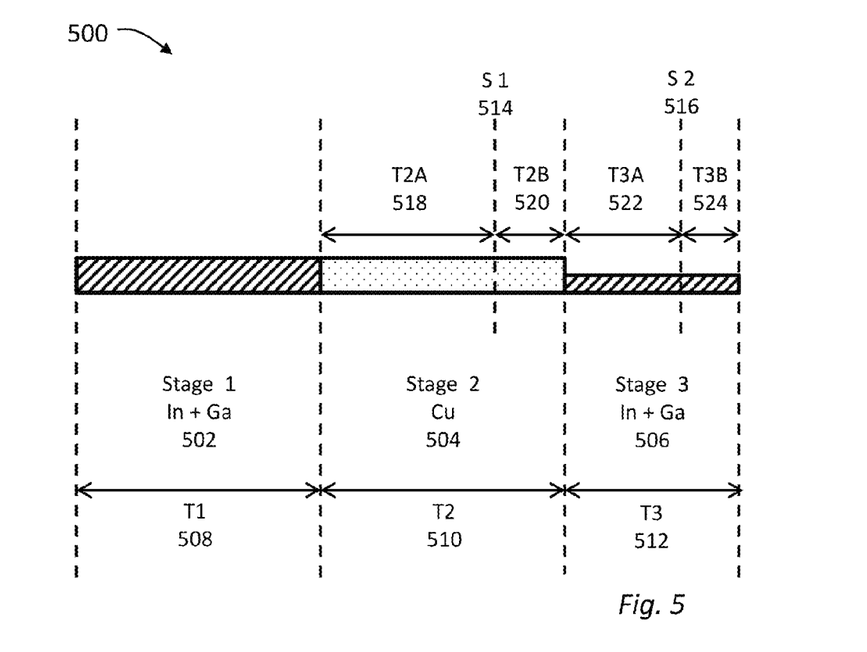
FIG. 5 is a schematic representation of selected time stages associated with a three-stage deposition process as disclosed herein

FIG. 5 provides a more detailed graphical illustration of certain aspects of a method 500 of depositing a thin film. In particular, the method 500 includes the deposition of a $Cu(In_xGa_{1-x})Se_2$ absorber layer in a three-stage deposition process. In the illustrated method, In+Ga is deposited in a first stage 502; Cu is deposited in a 2nd stage 504 and In+Ga is again deposited in a third stage 506. The overall deposition time for each stage is designated as T1, T2 and T3 respectively and marked as elements 508, 510 and 512 in FIG. 5.

As noted above, it is desirable in a three stage CIGS deposition process that the molar quantity of Cu should exceed the molar quantity of In+Ga in the second stage 504. This particular stoichiometric sequence results in large grains being formed within the deposited matrix. Since the first stage includes In+Ga deposition without Cu, a stoichiometry point, S1 (514), exists and is passed as Cu is deposited in the 2nd stage 504. In addition, because the final $Cu(In_xGa_{1-x})Se_2$ film has a Cu/(In+Ga) ratio of less than 1 there exists another stoichiometry point, S2 (516) that exists and is passed in the 3rd stage. These stoichiometry points S1 and S2 may also be observed on FIG. 3. In a system such as system 200 or 400 the points S1 and S2 would be observed or detected with one or more optical probes 210 and 416 respectively.

Accordingly, the entire time of the 2nd stage (T2) may be conceived as being divided into two parts separated by the stoichiometric point S1. On FIG. 5, the initial second-stage time period is designated as T2A (518) and is the period before S1 with the balance of the entire second-stage time period, T2B, (520) being after S1. Similarly, the deposition time of the third stage (T3) may be divided by the stoichiometric point S2 into T3A (522) and T3B (524).

To comply with the required stoichiometry at S1 and S2, the following deposition rates must be satisfied:

$$R1*T1=R2*T2A \quad (1)$$

$$R2*T2B=R3*T3A \quad (2)$$

In equation (1) R1 is the [In+Ga] deposition rate expressed as the number of atoms per unit time in the first stage and R2 is the Cu deposition rate in the second stage. R3 is the [In+Ga] rate in the third stage. The total Cu/[In+Ga] ratio (denoted as parameter C below) at the end of the deposition is:

$$Cu/[In+Ga]=C=R2*T2/(R1*T1+R3*T3) \quad (3)$$

Another parameter denoted as D herein is used to describe the distribution of [In+Ga] into the first and third stages. D is therefore defined as the amount (In, Ga) deposited in the third stage divided by the amount of (In, Ga) deposited in the 1st stage. Therefore:

$$D=R3*T3/(R1*T1) \quad (4)$$

Based upon the foregoing, R2 and R3 can be expressed as follows:

$$R2=R1*(T1/T2A) \quad (5)$$

$$R3=R1*(T2B/T3A)(T1/T2A) \quad (6)$$

Equations (5) and (6) may be applied to equations (3) and (4). By canceling R1 it may be noted, since T2=T2A+T2B and T3=T3A+T3B:

$$Cu/[In+Ga]=C=T3A*T2/[(T3A*T2)+(T3B*T2B)] \quad (7)$$

$$D=R3*T3/(R1*T1)=T2B/*T3/(T3A*T2A) \quad (8)$$

Equations (7) and (8) can be modified as needed based upon the number of deposition stages required by a selected process. For example, in the case of a 2-stage deposition, the Cu/[In+Ga] ratio is simply T2/T2A. Equations (7) and (8) reveal that parameters C and D may be estimated purely from the lengths of different periods in the 3 stage process, without knowing the actual deposition rates of any stages. In addition:

$$T2B=[C(1+D)-1]T2A \quad (9)$$

$$T3B=(1/C-1)T3A*T2/T2B \quad (10)$$

Equations (9) and (10) reveal that if specific values for both C and D are targeted, a proper T2B time period may be calculated immediately after S1 is detected. In addition, the proper T3B time period may be calculated immediately after S2 is detected. Therefore, a system providing for the calculation of the above parameters can include a real time control signal causing relatively precise termination of both the second and third stages in order to achieve the target values for both C and D. The absolute thickness of the final film, the only "free" parameter left, can be controlled by optically monitoring the status of interference fringes at end of the first stage. Thus, the described optical methods may be used in a system to measure and control the Cu/[In+Ga] ratio, the distribution of [In+Ga] into the first and third stages, and the final film thickness in real time.

The stoichiometry points S1 and S2 may be identified through real time spectroscopic ellipsometry (RTSE) as detailed in the discussion above and example below. In addition, other optical reflection measurements including but not limited to polarized reflectance of light and diffused reflectance may provide sensitivity similar to RTSE, with lower equipment cost.

The method described above with respect to a three-stage deposition process can be extended to an n (n≥3) stage deposition process. In this case Equation (1) will become:

$$R1*T1 = R2*T2A \quad (11)$$

$$R2*T2B = R3*T3A \quad (12)$$

$$\ldots$$

$$R_{n-1}*T_{n-1}B = R_n*T_nA \quad (13)$$

Parameter C then becomes, assuming n is odd below:

$$C=[(R2*T2)+(R4*T4)+\ldots+(R_{n-1}*T_{n-1})]/[(R1*T1)+(R3*T3)+\ldots+(R_n*T_n)] \quad (14)$$

Two elemental distribution relationships (instead of a single value) may be defined as follows, again assuming n is odd below (this method can be applied to an even n as well):

$$D_1:R1T1:R3T3:R5T5:\ldots:R_nT_n \quad (15)$$

$$D_2:R2T2:R4T4:R6T6:\ldots:R_{n-1}T_{n-1} \quad (16)$$

From Equations (11)-(13), it can be seen that all deposition rates except R1 are not independent. Two consecutive rates are linearly connected by the following relationship:

$$R_{k-1}T_{k-1}B=R_kT_kA \text{ where } (2\leq k\leq n) \quad (17)$$

As a result, all $R_n$ (n≥2) are linear functions of R1, which can then be eliminated from Equation (14) and relations (15) and (16). Because T1, $T_kA$ and $T_kB$ for (2≤k≤n) are measurable quantities, either through the deposition control system or through the detection of the stoichiometry point $S_k$ with optical reflection measurements as described above, each parameter C and relationships $D_1$ and $D_2$ can be estimated in real time. If a target C and target distributions $D_1$ and $D_2$ are identified, then the proper length of $T_kB$ (2≤k≤n) can be calculated immediately after the stoichiometry point $S_k$ is detected and hence $T_kA$ becomes known. In addition, the absolute thickness of the deposited film, which is the only "free" parameter left, can be controlled through optical observation of the interference fringes at the end of the first stage. This way, the final elemental composition of the thin film, in particular the 11/13 ratio and the elemental distribution relationships $D_1$ and $D_2$ plus the final film thickness can each be measured and controlled in real time for a multi-stage deposition process having any number of stages.

The method described above is also applicable to certain modified multi-stage deposition processes. For example, in the case of a CuInSe$_2$ three stage deposition, if: (1) Cu is deposited in the first stage at a low rate of $R_1^{Cu}$ that is smaller than the In rate $R_1^{In}$, resulting in a Cu poor film at the end of the first stage; (2) only Cu is deposited in the $2^{nd}$ stage at a rate R2 with a known relation to $R_1^{Cu}$ (for example, R2=$R_1^{Cu}$); and (3) only In is deposited in the third stage at a rate of R3, then we can simply replace T2A with (T2A+T1) and Equations (7-10) are still true. The exemplary assumption R2=$R_1^{Cu}$ can be generalized to R2=$\alpha R_1^{Cu}$ and hence T2A should be replaced with (T2A+T1/$\alpha$), where the coefficient $\alpha$ can be controlled, for example by adjusting the size of the outlet of the Cu source.

In addition, another quantity which can be measured and controlled by the disclosed optical methods is the distribution of Cu between the $1^{st}$ and $2^{nd}$ stages of a CuInSe$_2$ three stage deposition. In this case, T1/$\alpha$:T2A. Other modifications of the multi-stage process exist. For example, In+Ga flux may be added on top of the Cu flux in the $2^{nd}$ stage or Cu flux may be added on top of In+Ga flux in the third stage. The disclosed methods and apparatus may be utilized with many modified multi-stage deposition techniques.

Figure 6:
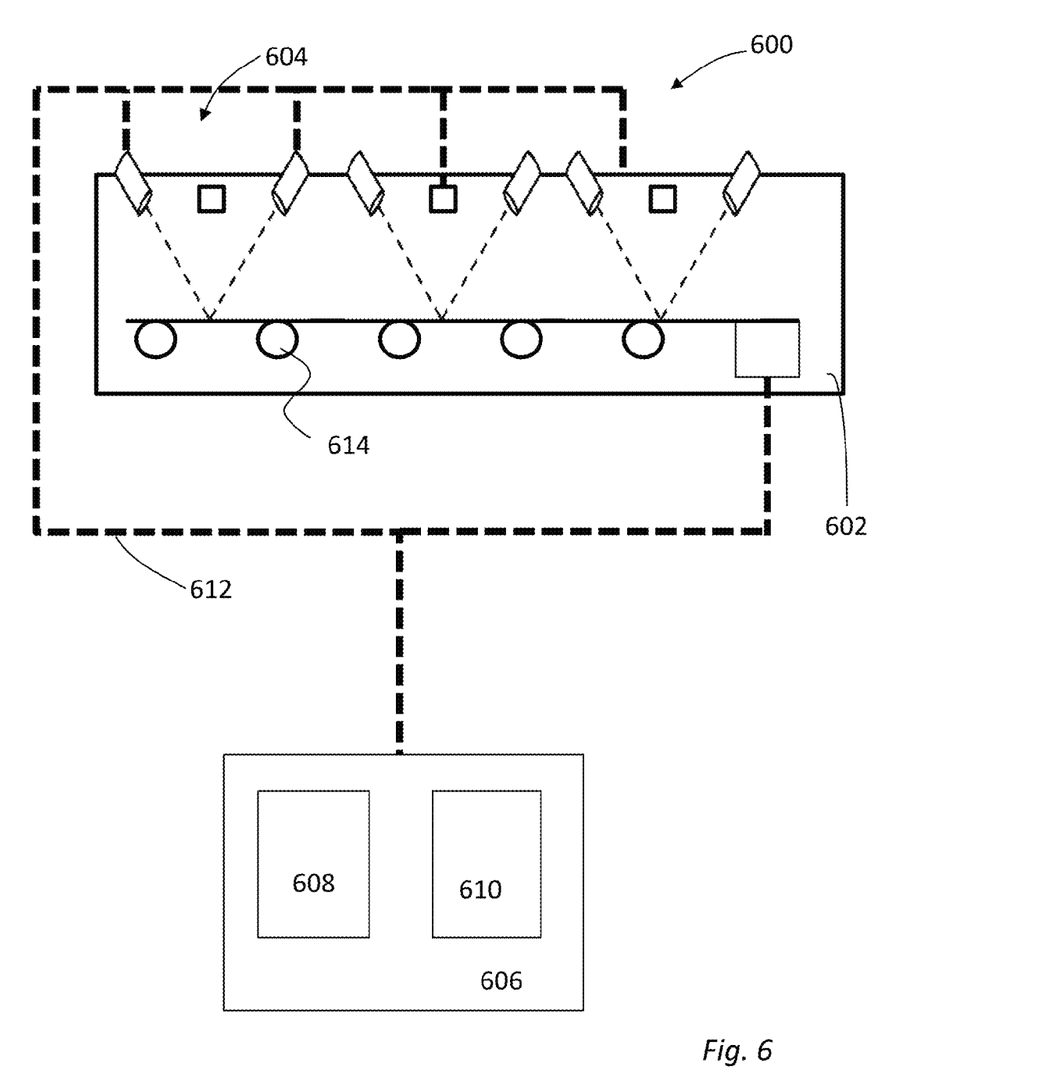
FIG. 6 is a simplified schematic diagram of a computer controlled deposition system as disclosed herein.

As noted above, the described methods may be implemented in a system which automatically or semi-automatically controls a deposition process. For example, as schematically illustrated in FIG. 6, a system 600 may include a deposition chamber 602 or other apparatus where multi-stage deposition may occur. The deposition chamber 602 may be associated with one or multiple optical probes 604 which function as described above with respect to systems 200 and 400. Optical data collected by an optical probe 604 may be communicated in analog or digital form to a computer system 606. The computer system 606 may be a standalone computer, or a control module included within another element of the system 600. The computer system 606 will include a controller 608 in digital communication with non-transitory machine readable medium 610 having encoded thereon a set of instructions executable by the controller to perform one or more operations. Thus, as schematically illustrated in FIG. 6, the controller may execute instructions to interpret optical data received from an optical probe 604 and determines when a transition point such as a stoichiometry point occurs.

The controller may also execute instructions to determine the time of selected overall processes, the length of any particular deposition stage and the length of any portion of a deposition stage or any other time variable. Furthermore, the controller may digitally communicate over cables 612, wires, wirelessly or through a bus or other known communications pathway instructions to other apparatus associated with the system 600 to control the deposition process or ultimately control the composition, structure or characteristics of a deposited film. For example, the controller may execute instructions to begin or terminate a deposition process, control a deposition rate, deposition temperature, deposition pressure, deposition atmosphere composition, the selection of deposition targets or any other deposition parameter. In addition the controller may execute instructions controlling any transport system 614, for example the controller may execute instructions selecting or varying the speed at which a substrate is transported through the system 600 or controlling selected stop points or transport/processing delay stages.

In the foregoing manner, the controller may automatically control film thickness, film composition, film quality, the distribution of elements within the film and other parameters based upon optical data collected by the one or more optical probes 604.

EXAMPLE

The following example is provided for illustrative purposes only and is not intended to limit the scope of embodiments of the present disclosure. CIGS films as described below were deposited in a co-evaporation chamber with MBE capability. For each sample, a 6"×6" substrate was used. The substrate was Na-containing glass coated with an approximately 0.4 μm thick Mo contact layer deposited by DC sputtering. During the CIGS deposition, the substrate was rotated at a speed of 20 rpm. A pyrometer working at a wavelength of 1.5 μm was used to remotely measure the substrate temperature. Real-time ellipsometry measurements were performed through a pair of windows that define an incident point 2 inches from the center of the substrate. Therefore, the probed area falls on a circle with a 2 inch radius centered on the substrate (see corner graphic 700 of FIG. 7). Optically extracted film properties were compared to the optimal or target values to control the start and termination of all three stages of a three-stage deposition process.

After each deposition, X-ray fluorescence (XRF) measurements were performed on three points from the center to a corner along the semi-diagonal of the substrate to address the possible non-uniformity in the sample plane. Solar cell devices were fabricated on selected CIGS/Mo/glass samples, with standard CdS/i-ZnO/ZnO:Al structure (no anti-reflection coating) deposited through standard processes.

For a 3-stage deposition of CIGS films, conventional process control relies mainly on the following techniques: (1) calibration of rate vs. source temperature for each element; (2) calibration of rate vs. spatial flux of each element measured through electron impact emission spectroscopy (EIES), and (3) detection of the Cu-poor to Cu-rich transition in the 2nd stage by monitoring the substrate temperature, either through a thermocouple in contact with the substrate or through a remotely sensing pyrometer. However, techniques 1 and 2 are not direct measurements of the film. They have also been observed to be unreliable because of the effects of other factors such as the level of remaining material in the effusion source and the Se overpressure. The application of the 3rd technique is also challenging because the temperature curve near the transition usually exhibits a broad feature whose specific shape depends on other factors as well, leading to an indeterminate signal for termination of the 2nd stage.

To evaluate the process control capabilities of the conventional techniques and the optical metrology described herein, two series of 10 consecutive CIGS depositions were compared: MBE_228 ("MBE" is the chamber name, not the growth method) through MBE_237 were controlled by the pyrometer+rates calibration method, and MBE_313 through MBE_322 were controlled by the disclosed in situ optical metrology. It should be noted that these depositions were not solely for the comparison purpose—there were other process variables within them, as explained later. But since the depositions had a common target of 0.88 for the Cu/[In+Ga] ratio, and were consecutive without any maintenance break in the middle (minimizing the intrinsic system instability), the described CIGS depositions can provide a useful comparison of the disclosed control method with prior techniques.

One purpose of the MBE_313 series was to test the effects of source temperatures of a new Se container. According to a quartz crystal monitor placed near the outlet of the Se source, the temperature variations detailed in Table 1 caused an approximately 6× variation in the Se rate, and consequently significant variations in the CIGS growth dynamics.

Figure 7:
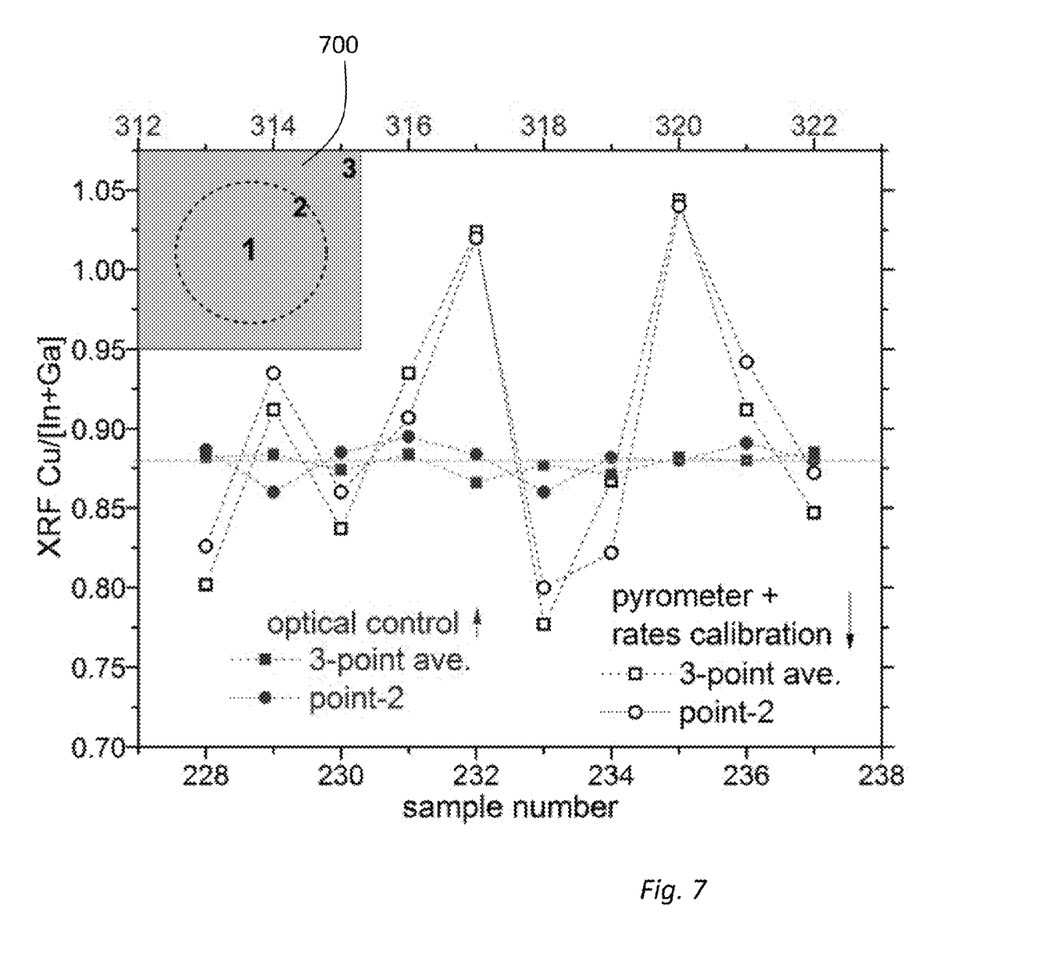
FIG. 7 is a graphical comparison the compositional consistency of thin films deposited using the disclosed optical control methods with the compositional consistency of films deposited while under conventional pyrometer+rate calibration methods of control.

In spite of this wide variation in Se overpressure, the optical control produced a series of highly consistent CIGS films (see Table 1 and FIG. 7). For the MBE_313 series, the average Cu/[In+Ga] ratio is 0.879 and the standard deviation is 0.00636 for the 3-point average, and 0.880 and 0.0117 for point-2, where the optical measurements were performed; whereas for the MBE_228 series, the statistical parameters are 0.896 and 0.0882 for the 3-point average, and 0.902 and 0.0823 for point-2. It appears that the run-to-run fluctuations in the MBE_313 series are less than the spatial non-uniformity variance or the XRF uncertainty that is estimated to be 0.035 experimentally, whereas the situation is opposite for the MBE_228 series. This comparison demonstrates that a factor of 10× improvement can be expected using the optical control compared to the standard methods.

TABLE 1

Film thickness measured by XRF, stage lengths determined by the optical control, and process variables for samples MBE_313 to MBE_322 and MBE_266 to MBE_270. For the latter series, the parameter "SIMS" is the film thickness below:above the minimum in the SIMS Ga curve.

| sample # | thickness (μm) | stage length (min.) 1st | 2nd | 3rd | Se temp. (° C.) bulk | valve | tube |
|---|---|---|---|---|---|---|---|
| MBE_313 | 2.311 | 20.50 | 16.62 | 4.60 | 390 | 410 | 430 |
| MBE_314 | 2.479 | 19.95 | 16.95 | 4.45 | 390 | 410 | 430 |
| MBE_315 | 2.475 | 20.92 | 17.12 | 3.91 | 395 | 415 | 435 |
| MBE_316 | 2.493 | 20.20 | 16.44 | 4.58 | 385 | 405 | 425 |
| MBE_317 | 2.580 | 19.93 | 16.40 | 5.25 | 380 | 400 | 420 |
| MBE_318 | 2.497 | 20.40 | 16.15 | 5.03 | 380 | 400 | 420 |
| MBE_319 | 2.282 | 23.00 | 14.55 | 4.25 | 375 | 400 | 425 |
| MBE_320 | 2.252 | 22.39 | 14.50 | 4.25 | 375 | 400 | 425 |
| MBE_321 | 2.107 | 22.10 | 13.35 | 4.42 | 370 | 395 | 420 |
| MBE_322 | 2.059 | 21.45 | 13.18 | 3.60 | 370 | 395 | 420 |

| sample # | thickness (μm) | 1st | 2nd | 3rd | target 1st:3rd | SIMS |
|---|---|---|---|---|---|---|
| MBE_266 | 2.065 | 14.45 | 16.05 | 7.35 | 75:25 | 69:31 |
| MBE_267 | 2.020 | 14.75 | 15.55 | 6.74 | 80:20 | 72:28 |
| MBE_268 | 1.923 | 12.90 | 15.26 | 7.97 | 70:30 | 66:34 |
| MBE_269 | 2.071 | 15.15 | 15.05 | 4.92 | 85:15 | 76:24 |
| MBE_270 | 2.013 | 10.80 | 15.40 | 10.54 | 60:40 | 62:38 |

The lengths of the three stages in Table 1 determined by the real time optical control indicate that if the processes had been controlled either assuming constant rates at fixed source temperatures or by adjusting the stage lengths for a sample based on the immediately previous sample, the resulting fluctuation of the Cu/[In+Ga] ratio would be significantly larger, making any downstream investigations using these samples less reliable. For example, both the thickness and the Cu/[In+Ga] ratios of MBE_315 and MBE_316 are very close to each other, but the 2nd stage (Cu deposition) length of MBE_316 is 4% shorter. This means, for MBE_316, if the Cu rate had been assumed to be the same as that of MBE_315, the instability of the Cu rate alone would cause the resulting Cu/[In+Ga] ratio to be upward deviated to ~0.92. If similar instability exists for the In and Ga rates, a deviation of ~±0.12 (absolute value) can be expected. However, the optical metrology probes the film directly instead of relying on pre-established rate calibrations, and hence can adjust the stage lengths accordingly to reach the target, making the actual deviations significantly smaller. Similar arguments can be made for the stage lengths for the other series of CIGS depositions in Table 1, MBE_266 to MBE_270, that were also controlled by the disclosed optical metrology.

Figure 8:
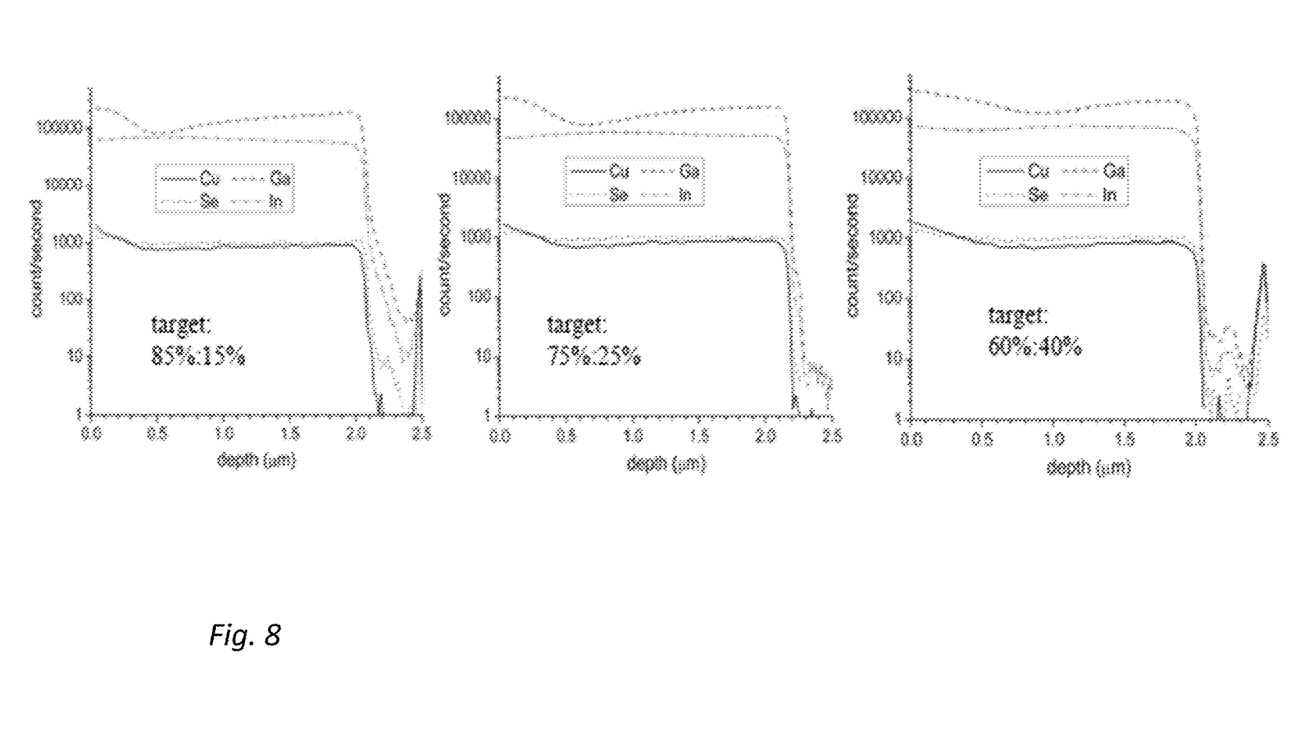
FIG. 8 is a graphical representation of selected results and analysis of the disclosed example system and method.

The MBE_266 series served to test the reliability of the optical control with variations in the In+Ga distribution between the 1st and 3rd stages. All the films were designed to have a Cu/[In+Ga] ratio of 0.88 and a thickness of 2.0 μm. XRF measurements on the resulting CIGS films indicate that the Cu/[In+Ga] ratio is in the range of 0.842-0.884 for the 3 point average, and 0.855-0.886 for point-2. The thicknesses are within ±0.08 μm from the target (Table 1). Secondary ion mass spectrometry (SIMS) depth profiling was performed. Because Ga has a low diffusion coefficient, the depth of the dip in the Ga curve is a qualitative indication of the In+Ga distribution. The calculated ratio of CIGS film thickness below:above the minimum in the Ga curve is shown in Table 1. FIG. 8 illustrates the SIMS depth profiles of three CIGS films designed to have the same thickness and Cu/(In+Ga) ratio, but which were varied In+Ga distribution from 85%: 15% (1st stage:3rd stage) to 60%:40% (1st stage:3rd stage). The position of the dip in the Ga curve of FIG. 8 is an indication of the In+Ga distribution. From Table 1 and the SIMS spectra of FIG. 8, it can be seen that the sample design was realized.

Figure 9:
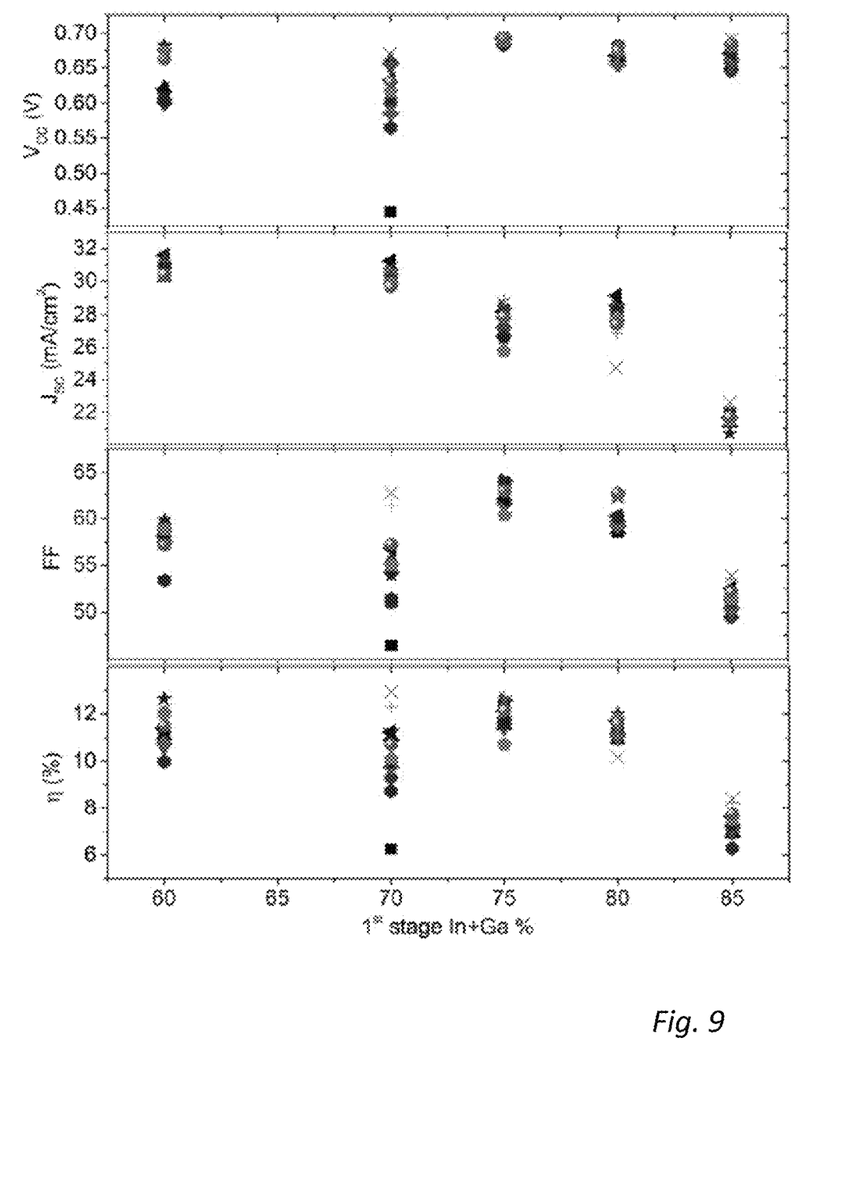
FIG. 9 is a graphical representation of selected results and analysis of the disclosed example system and method.

The performance of the above described solar cell devices fabricated on $Cu(In_{1-x}Ga_x)Se_2$ films with similar Cu/[In+Ga] ratio and thickness, but with variations in the In+Ga distribution between the 1st and 3rd stages are compared in FIG. 9. The following may be noted from the data presented in FIG. 9:

(1) The 70:30 cells exhibit large performance characteristics variations, possibly due to spatial non-uniformity in any layers including the CIGS layer;

(2) $V_{OC}$ remains relatively constant without a clear trend;

(3) $J_{SC}$ decreases with increasing 1st stage percentage, which caused shorter deposition of Cu after the Cu-poor to Cu-rich transition in the 2nd stage. Since excessive Cu is important for grain growth, the lower $J_{SC}$ may result from small grains near the surface, which is supported by the SEM images;

(4) The fill factor (FF) has an optimum near the percentage range of 70-75. The drop of FF below this range may be related to the hole structures on the CIGS surface, observed in SEM images, that were caused by too much excess of Cu in the 2nd stage; and (5) cell efficiency ($\eta$) stays relatively flat in the percentage range of 60-80, and drops when it is larger than 80. The dominant reason is clearly the trend of $J_{SC}$.

Real time in situ optical metrology as disclosed herein can precisely control: (1) the Cu/(In+Ga) ratio; (2) the distribution of In+Ga between the 1st and 3rd stages; and (3) the film thickness of CIGS films deposited through the 3-stage method. The resulting films provide a consistent base and increase the confidence for investigating specific process variables, facilitating the search and optimization in the high dimensional parameter space. This metrology also holds significant promise for application for real-time in-line control of absorber deposition processes in PV module manufacturing. Similar optical metrologies can also be developed for other CIGS deposition techniques, such as the two stage selenization process.

The description of the disclosed embodiments has been presented for purposes of illustration and description, but is not intended to be exhaustive or limiting of the claims to any particular form disclosed. The scope of the present disclosure is limited only by the scope of the following claims. Many modifications and variations will be apparent to those of ordinary skill in the art. The embodiments described and shown in the figures were chosen and described in order to best explain the principles of the various embodiments, the practical application, and to enable others of ordinary skill in the art to understand the various embodiments with various modifications as are suited to the particular use contemplated.

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope of the disclosure.

Various embodiments of the disclosure could also include permutations of the various elements recited in the claims as if each dependent claim was a multiple dependent claim incorporating the limitations of each of the preceding dependent claims as well as the independent claims. Such permutations are expressly within the scope of this disclosure.

What is claimed is:

1. A method comprising:
depositing, during a first deposition stage, a first material on a surface associated with a substrate, thereby forming a deposition matrix;
depositing, during a second deposition stage, a second material on the deposition matrix;
monitoring, using an optical probe, the deposition matrix during the second deposition stage;
determining, based on the monitoring during the second deposition stage, a first time when a first transition point occurs; and
modifying, based on the first time, at least one deposition parameter of the second deposition stage.

2. The method of claim 1, further comprising:
depositing, during a third deposition stage, an additional amount of the first material on the deposition matrix;
monitoring the deposition matrix during the third deposition stage;
determining, based on the monitoring during the third deposition stage, a second time when a second transition point occurs; and
modifying, based on the second time, at least one deposition parameter of the third deposition stage.

3. The method of claim 1, wherein the first transition point is a stoichiometry point.

4. The method of claim 2, wherein the first and second transition points are stoichiometry points.

5. The method of claim 1, wherein the first material comprises at least one Group 13 element and the second material comprises at least one Group 11 element.

6. The method of claim 5, wherein the first material comprises In and Ga and wherein the second material comprises Cu.

7. The method of claim 2, wherein at least one of the first deposition stage, the second deposition stage, or the third deposition stage is performed in an atmosphere that comprises an excess amount of at least one element that is absent from the first material or the second material.

8. The method of claim 1, wherein monitoring the deposition matrix comprises performing at least one of ellipsometry, polarized reflectance spectroscopy, or diffuse reflectance spectroscopy.

9. The method of claim 2, further comprising moving the substrate within a deposition chamber while performing at least one of the first deposition stage, the second deposition stage, or the third deposition stage.

10. The method of claim 1, wherein modifying the at least one deposition parameter of the second deposition stage comprises modifying at least one of: a deposition rate at which the first material is deposited during the second deposition stage or a duration of the second deposition stage.

11. The method of claim 9, wherein at least one of modifying the at least one deposition parameter of the second deposition stage or modifying the at least one deposition parameter of the third deposition stage comprises adjusting a speed at which the substrate is moved within the deposition chamber.

12. The method of claim 2, further comprising determining a final compositional ratio of deposited first material to deposited second material based upon on:
the first time;
the second time;
a total duration of the second deposition stage; and
a total duration of the third deposition stage.

13. The method of claim 2, further comprising determining a ratio of an amount of the first material deposited during the first deposition stage to the additional amount of the first material deposited during the third deposition stage based on:
the first time;
the second time;
a total duration of the second deposition stage; and
a total duration of the third deposition stage.

14. The method of claim 1, further comprising:
monitoring the deposition matrix during the first deposition stage; and
determining, based on the monitoring during the first deposition stage, a thickness of the deposition matrix.

15. The method of claim 2, wherein modifying the at least one deposition parameter of the third deposition stage comprises at least one of: adjusting a deposition rate at which the additional amount of the first material is deposited during the third deposition stage, or adjusting a duration of the third deposition stage.

16. The method of claim 1, wherein modifying the at least one deposition parameter of the second deposition stage comprises determining a first duration for which to extend the second deposition stage beyond the first time, based on:
a target ratio of the deposited first material to the deposited second material,
a target ratio of the deposited first material to the deposited additional amount of the first material, and
the first time.

17. The method of claim 16, further comprising, responsive to the first duration elapsing subsequent to the first time, terminating the second deposition stage.

18. The method of claim 2, wherein modifying the at least one deposition parameter of the third deposition stage comprises determining a first duration for which to extend the second deposition stage beyond the first time, based on:
a target ratio of the deposited first material to the deposited second material,
the first time,
a total duration of the second deposition stage, and
the second time.

19. The method of claim 18, further comprising, responsive to the first duration elapsing subsequent to the second time, terminating the third deposition stage.

20. The method of claim 1, wherein modifying the at least one deposition parameter of the second deposition stage is performed in the absence of at least one of a deposition rate of the first material during the first deposition stage and a deposition rate of the second material during the second deposition stage are unknown.

21. The method of claim 2, wherein the optical probe comprises a first optical probe, and wherein monitoring the deposition matrix during the third deposition stage is performed using a second optical probe different from the first optical probe.

22. The method of claim 14, further comprising modifying, based on the thickness of the deposition matrix and a target total thickness, at least one of:
at least one deposition parameter of the first deposition stage; or
the at least one deposition parameter of the second deposition stage.

23. A system comprising:
a deposition apparatus configured to:
deposit, during a first deposition stage, a first material on a surface associated with a substrate, thereby forming a deposition matrix, and
deposit, during a second deposition stage, a second material on the deposition matrix;
an optical probe configured to:
monitor the deposition matrix during the second deposition stage, and
generate first data representing a state of the deposition matrix during the second deposition stage;
a processor operatively coupled to the deposition apparatus and to the optical probe, wherein the processor is configured to:
receive, from the optical probe, the first data,
determine, based on the first data, a first time when a first transition point occurs, and
modify, based on the first time, at least one deposition parameter of the second deposition stage.

24. The system of claim 23, wherein:
the deposition apparatus is further configured to deposit, during a third deposition stage, an additional amount of the first material on the deposition matrix;
the optical probe is further configured to:
monitor the deposition matrix during the third deposition stage, and
generate second data representing a state of the deposition matrix during the third deposition stage; and
the processor is further configured to:
receive, from the optical probe, the second data,
determine, based on the second data, a second time when a second transition point occurs, and
modify, based on the second time, at least one deposition parameter of the third deposition stage.

25. The system of claim 23, wherein the first material comprises at least one Group 13 element and the second material comprises at least one Group 11 element.

26. The system of claim 25, wherein the first material comprises In and Ga and the second material comprises Cu.

27. The system of claim 24, wherein at least one of the first deposition stage, the second deposition stage, or the third deposition stage is performed in an atmosphere that comprises an excess amount of at least one element that is absent from the first material or the second material.

28. The system of claim 23, wherein the optical probe is configured to monitor the deposition matrix by performing at least one of ellipsometry, polarized reflectance spectroscopy, or diffuse reflectance spectroscopy.

29. The system of claim 24, further comprising a mechanical conveyor configured to move the substrate during at least one of first deposition stage, the second deposition stage, or the third deposition stage.

30. The system of claim 23, wherein the processor is configured to modify the at least one deposition parameter of the second deposition stage by modifying at least one of: a deposition rate at which the deposition apparatus deposits the first material during the second deposition stage or a duration of the second deposition stage.

31. The system of claim 24, wherein the processor is further operable to determine a final compositional ratio of deposited first material to deposited second material based on:
the first time;
the second time;
a total duration of the second deposition stage; and
a total duration of the third deposition stage.

32. The system of claim 24, wherein the processor is further operable to determine a ratio of an amount of the first material deposited during the first deposition stage to the additional amount of the first material deposited during the third deposition stage based on:
the first time;
the second time;

a total duration of the second deposition stage; and
a total duration of the third deposition stage.

33. The system of claim 23, wherein the optical probe is further configured to:
monitor the deposition matrix during the first deposition stage; and
generate third data representing a state of the deposition matrix during the first deposition stage, and wherein the processor is further configured to:
receive, from the optical probe, the third data, and
determine, based on the third data, a thickness of the deposition matrix.

* * * * *